(12) United States Patent
Jung

(10) Patent No.: US 9,024,409 B2
(45) Date of Patent: May 5, 2015

(54) SEMICONDUCTOR DEVICE AND METHOD FOR FORMING THE SAME

(71) Applicant: SK Hynix Inc., Icheon (KR)

(72) Inventor: Tae O Jung, Seoul (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/165,379

(22) Filed: Jan. 27, 2014

(65) Prior Publication Data

US 2014/0141593 A1 May 22, 2014

Related U.S. Application Data

(62) Division of application No. 13/347,505, filed on Jan. 10, 2012, now abandoned.

(30) Foreign Application Priority Data

Apr. 27, 2011 (KR) .......... 10-2011-0039692

(51) Int. Cl.
*H01L 21/762* (2006.01)
*H01L 21/76* (2006.01)
*H01L 21/761* (2006.01)
*H01L 29/06* (2006.01)
(Continued)

(52) U.S. Cl.
CPC .......... *H01L 21/76262* (2013.01); *H01L 21/76* (2013.01); *H01L 21/761* (2013.01); *H01L 21/762* (2013.01); *H01L 21/76205* (2013.01); *H01L 29/0649* (2013.01); *H01L 27/10873* (2013.01); *H01L 27/10894* (2013.01); *H01L 29/0615* (2013.01); *H01L 29/4236* (2013.01); *H01L 29/0623* (2013.01); *H01L 21/76229* (2013.01); *H01L 21/76224* (2013.01)

(58) Field of Classification Search
CPC ............. H01L 29/7827; H01L 29/66666;
H01L 29/66712; H01L 29/7393; H01L 29/7424; H01L 21/02293; H01L 29/7395;
H01L 21/76; H01L 21/761; H01L 21/76202;
H01L 21/762; H01L 21/76205; H01L 21/76224; H01L 21/76262; H01L 21/76264;
H01L 21/76278
USPC .......... 438/140, 197, 206, 207, 208, 212, 218, 438/220, 268, 294, 353
See application file for complete search history.

(56) References Cited

U.S. PATENT DOCUMENTS 6,271,070 B2 * 8/2001 Kotani et al. .................. 438/207
8,304,316 B2 * 11/2012 Udrea et al. .................. 438/294
(Continued)

FOREIGN PATENT DOCUMENTS

KR 10-2007-0033224 A 3/2007
KR 10-2008-0016327 A 2/2008
(Continued)

*Primary Examiner* — Eduardo A Rodela (57) ABSTRACT

A semiconductor device and a method for forming the same are disclosed. In a method for forming the semiconductor substrate including a cell region and a peripheral region, a guard pattern defined by an epitaxial growth layer located at the edge part between the cell region and the peripheral region is formed. As the guard pattern is not damaged by an oxidation process, a bias leakage path between an N-well bias and a P-well bias of the peripheral region is prevented from occurring Reliability of a gate oxide film may be increased, resulting in an increased production yield of the semiconductor device and implementation of stable voltage and current characteristics.

10 Claims, 6 Drawing Sheets

(51) Int. Cl.
*H01L 27/108* (2006.01)
*H01L 29/423* (2006.01)

(56) References Cited

U.S. PATENT DOCUMENTS

2005/0073004 A1* 4/2005 Onda et al. .................... 257/341
2006/0043480 A1* 3/2006 Tsuchitani et al. ........... 257/341
2011/0024833 A1 2/2011 Jang
2013/0122663 A1* 5/2013 Lu ................................. 438/138

FOREIGN PATENT DOCUMENTS

| KR | 10-2011-0001135 A | 1/2011 |
| KR | 10-2011-0013034 A | 2/2011 |

* cited by examiner

Fig.5d

SEMICONDUCTOR DEVICE AND METHOD FOR FORMING THE SAME

CROSS-REFERENCE TO RELATED APPLICATION

The present application is a divisional of U.S. patent application Ser. No. 13/347,505, filed on Jan. 10, 2012, which claims priority of Korean Patent Application No. 10-2011-0039692 filed on Apr. 27, 2011, which are incorporated by reference in their entirety.

BACKGROUND OF THE INVENTION

The present invention relates to a semiconductor device and a method for forming the same, and more particularly to a semiconductor device including a guard pattern formed at the border between a cell region and a peripheral region, and a method for forming the same.

A semiconductor memory device includes a plurality of unit cells, each of which includes a capacitor and a transistor. The capacitor is used to temporarily store data therein. The transistor is used to transmit data between a bit line and the capacitor in response to a control signal (i.e., a signal on a word line) using the electrical conductivity of the semiconductor memory device that changes depending on environment. The transistor has three regions including a gate, a source and a drain, where charges between the source and the drain move through a channel region in response to the control signal input to the gate.

When a typical transistor is formed using a semiconductor substrate, a gate is formed on the semiconductor substrate, and impurities are doped at both sides of the gate to form a source and a drain. In this case, a region between the source and the drain under the gate becomes a channel region of the transistor. The transistor including the horizontal channel region occupies a predetermined area of the semiconductor substrate. Accordingly, it is difficult to reduce the overall area of a complicated semiconductor device since a semiconductor device includes a plurality of transistors.

If the overall area of the semiconductor device is reduced, the number of semiconductor devices capable of being present on each wafer increases, resulting in increased productivity. Accordingly, a variety of methods have been proposed to reduce the overall area of the semiconductor device.

A representative method uses a recess gate instead of a planar gate including a horizontal channel region. With the progress of development of the recessed gate approach, a variety of methods for burying the entirety of the gate in a recess to form a buried gate have recently been proposed.

A conventional method for forming a semiconductor device including a buried gate includes forming a cell region, removing the entirety of materials deposited over a substrate that corresponds to a peripheral region using an open mask for the peripheral region, and forming a transistor in the peripheral region. In such a process, gas injected in an oxidation process for forming a gate oxide film of a transistor in the peripheral region may be applied to a cell transistor in the cell region through a device isolation layer. This may cause a gate oxide film of the cell transistor to be oxidized, resulting in the deterioration of reliability of the gate oxide film of the cell transistor. In order to solve the above-mentioned problem, a guard pattern defined as an active region is formed at the border between the cell region and the peripheral region, such that gas input through the device isolation layer is blocked by the guard pattern.

However, the guard pattern may be damaged in an etch process for opening the cell or peripheral region, resulting in the occurrence of a crack in the guard pattern. The crack may generate a current path between wells, and thus bias leakage failure may occur by the current path.

Figure 1:
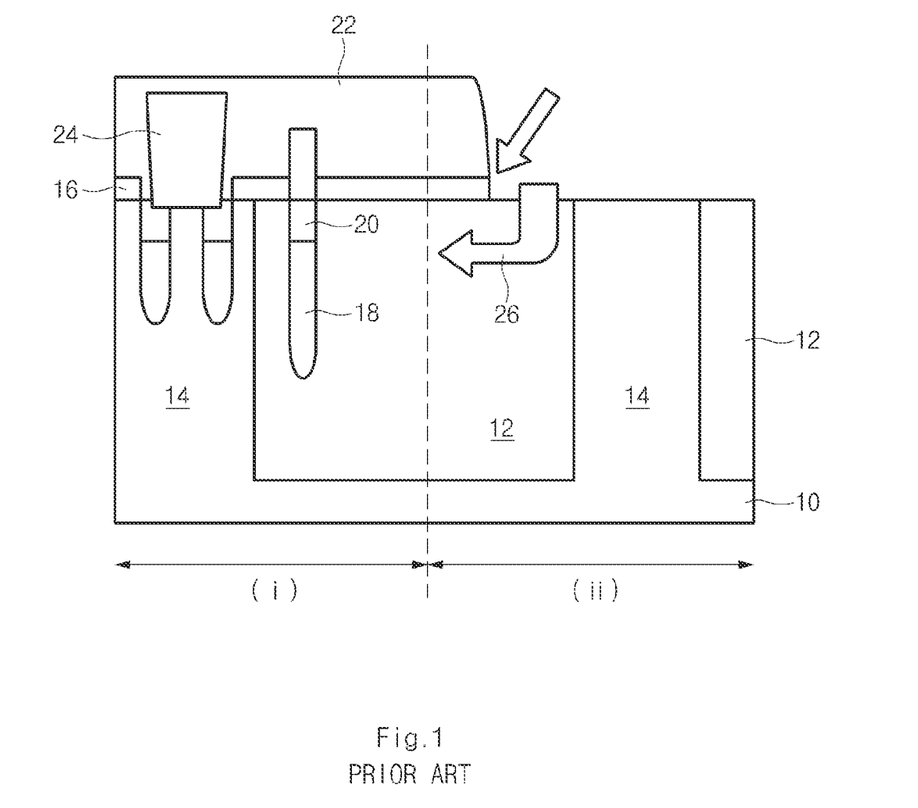
FIG. 1 illustrates a cross-sectional view of a conventional semiconductor device.
Figure 2:
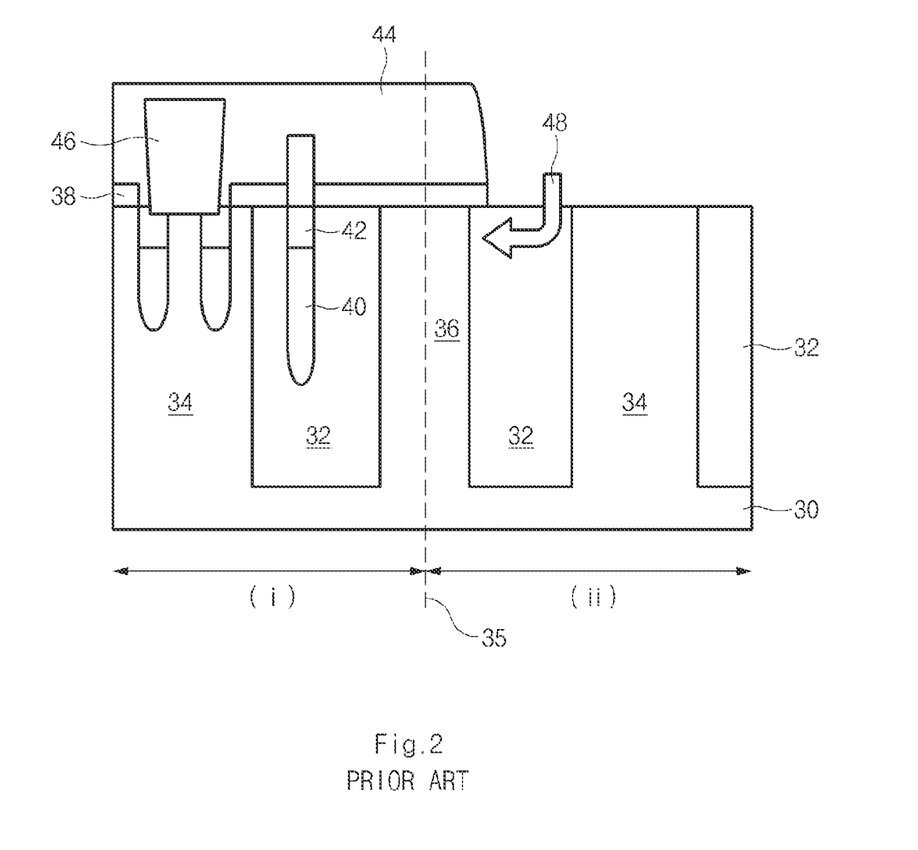
FIG. 2 illustrates a cross-sectional view of another conventional semiconductor device.
Figure 3:
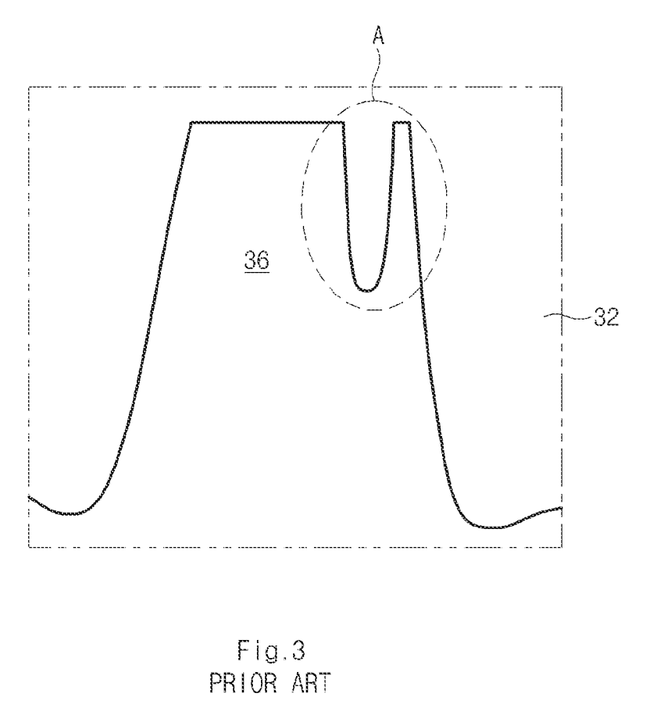
FIG. 3 is a transmission electron microscope (TEM) representation illustrating a cross-sectional view of a conventional semiconductor device including a damaged guard pattern.

FIG. 1 illustrates a cross-sectional view of a conventional semiconductor device. FIG. 2 illustrates a cross-sectional view of another conventional semiconductor device. FIG. 3 is a transmission electron microscope (TEM) representation of a cross-sectional view of a conventional semiconductor device including a damaged guard pattern.

Referring to FIG. 1, an active region 14 defined by a device isolation layer 12 is formed in a semiconductor substrate 10 including a cell region (i) and a peripheral region (ii). Subsequently, after a mask pattern 16 defining trenches is formed over the active region 14 and the device isolation layer 12, the active region 14 and the device isolation layer 12 in the cell region (i) are etched using the mask pattern 16 to form trenches.

Subsequently, an electrode material is filled in a lower portion of each trench to form a gate 18 in the trench. An insulation layer 20 and an interlayer insulation film 22 are sequentially formed over the gate 18, and then a conductive layer is buried to form a bit line contact plug 24 over the insulation layer 20.

After that, the interlayer insulation layer 22 formed in the peripheral region (ii) is removed to expose a portion of the device isolation layer 12, which is disposed in a portion of the peripheral region (ii) and adjacent to the cell region (i), and the active region 14 in the peripheral region (ii). As a result, an oxidation path 26 passing through the device isolation layer 12 disposed at the border between the cell region (i) and the peripheral region (ii) is generated in an oxidation process performed during the formation of a transistor in the peripheral region (ii). A gas injected through the oxidation path 26 may be applied to the cell region (i), so that the reliability of the cell gate oxide may be deteriorated.

Turning now to FIG. 2, in order to prevent the oxidation path 26 from being generated, an active region 34 defined by a device isolation layer 32 may be formed in a semiconductor substrate 30 including a cell region (i) and a peripheral region (ii). A guard pattern 36 defined by the device isolation layer 32 is formed at the border 35 between the cell region (i) and the peripheral region (ii).

Subsequently, after a mask pattern 38 defining trenches is formed over the active region 34 and the device isolation layer 32, the active region 34 and the device isolation layer 32 are etched using the mask pattern 38 to form trenches. Subsequently, an electrode material is filled in a lower portion of each trench to form a gate 40 in the trench.

An insulation layer 42 and an interlayer insulation layer 44 are sequentially formed over the gate 40, and then a conductive layer is buried to form a bit line contact plug 46 over the insulation layer 42. After that, the interlayer insulation layer 44 formed in the peripheral region (ii) is removed to expose the device isolation layer 32 and the active region 34 in the peripheral region (ii).

In the case of FIG. 2, an oxidation path 48 passing through the device isolation layer 32 is generated in an oxidation process performed during the formation of a transistor in the peripheral region (ii). However, since the guard pattern 36 is disposed between the cell region (i) and the peripheral region (ii), gas injection to the cell region (i) through the oxidation path 48 is blocked by the guard pattern 36.

As shown in A of FIG. 3, however, the guard pattern 36 may be damaged during a mask/etch process to open the cell region (i) or the peripheral region (ii), so that a crack may be generated in the guard pattern 36. The crack A in the guard pattern 36 may generate a current path between wells and thus cause bias leakage failure.

BRIEF SUMMARY OF THE INVENTION

Various embodiments of the present invention are directed to providing a semiconductor device and a method for forming the same, which may substantially obviate one or more problems due to limitations and disadvantages of the related art.

Embodiments of the present invention relate to a semiconductor device and a method for forming the same, which can solve the problems of the conventional semiconductor device in which a transistor in a cell region is oxidized along an oxidation path that is generated in an oxidation process performed when a transistor in a peripheral region is formed, or a guard pattern formed at the border between the cell region and the peripheral region is damaged by a mask/etch process performed to open the cell region or the peripheral region.

In accordance with an aspect of the present invention, a semiconductor device includes a semiconductor substrate including a cell region and a peripheral region; and a guard pattern including an epitaxial growth layer located at a border between the cell region and the peripheral region.

The semiconductor device may further include an active region defined by a device isolation layer disposed in the semiconductor substrate.

The semiconductor device may further include a gate disposed in the device isolation layer or in the active region of the cell region.

The guard pattern is disposed in the device isolation layer located at the border and has a same thickness as that of the device isolation layer.

The epitaxial growth layer is generated using the semiconductor substrate as a seed for the epitaxial growth.

In accordance with another aspect of the present invention, a method for forming a semiconductor device includes providing a semiconductor substrate including a cell region and a peripheral region, forming a device isolation layer defining an active region in the semiconductor substrate, and forming a guard pattern in the device isolation layer located at a border between the cell region and the peripheral region, the guard pattern including a growth layer.

The method may further include, after forming the device isolation layer defining the active region and before forming the guard pattern, performing an ion implantation process to define a well region in the semiconductor substrate.

The method may further include, after performing the ion implantation process and before forming the guard pattern, etching materials formed over the semiconductor substrate using a mask for opening the peripheral region to expose a portion of the semiconductor substrate that corresponds to the peripheral region.

The method may further include, upon completion of the etching for exposing the semiconductor substrate of the peripheral region, forming a gate not only in the active region of the cell region but also in the device isolation film.

Forming the guard pattern may includes forming a mask pattern to expose a top surface of a portion of the device isolation layer located at the border, etching the portion of the device isolation layer using the mask pattern as an etch mask until the semiconductor substrate is exposed and forming the growth layer in a region where the portion of the device isolation layer is etched using the semiconductor substrate as a seed for the growth.

The growth layer is formed to have a same thickness as that of the device isolation layer.

The mask pattern may include a photoresist film, an oxide film, or a nitride film.

In accordance with another aspect of the present invention, a method for forming a semiconductor device includes providing a semiconductor substrate including a cell region and a peripheral region, forming a device isolation layer to define an active region in the cell region and the peripheral region, exposing a top surface of the semiconductor substrate by etching a portion of the device isolation layer located at the border between the cell region and the peripheral region and performing the growth on the exposed semiconductor substrate to form a guard pattern in the device isolation layer located at the border.

The performing of the growth may include generation an epitaxial growth layer to have a same thickness as that of the device isolation layer.

As described above, according to the embodiments of the present invention, a guard pattern formed by an epitaxial growth is formed in the cell region and the peripheral region, so that the guard pattern is not damaged by an oxidation process. As a result, a bias leakage path between an N-well bias and a P-well bias of the peripheral region is prevented from occurring, and the reliability of a gate oxide film is increased, resulting in an increased production yield of the semiconductor device and implementation of stable voltage and current characteristics.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 4:
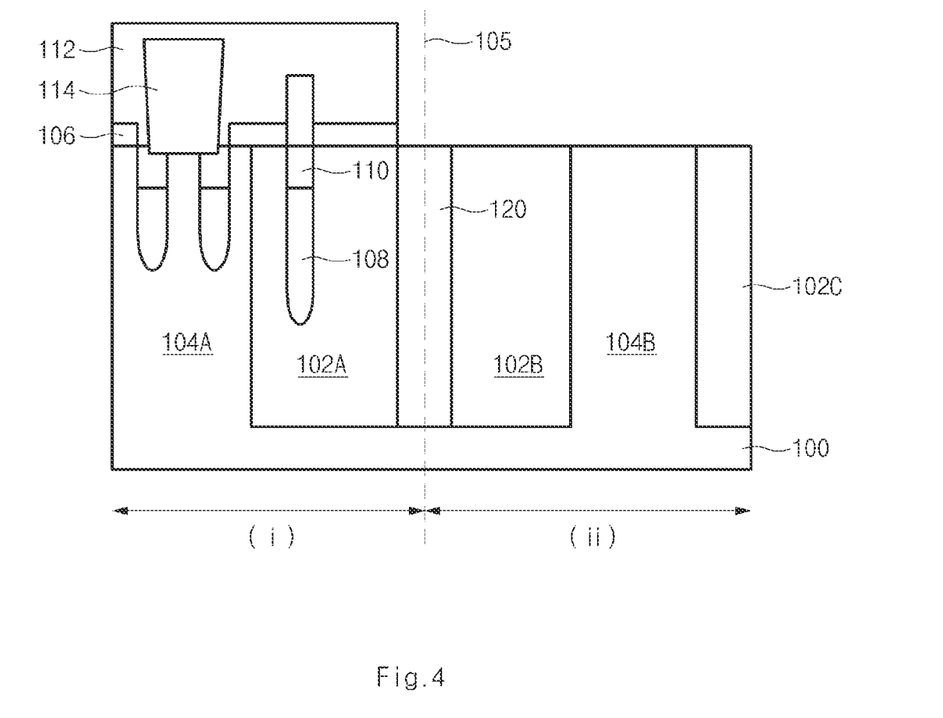
FIG. 4 illustrates a cross-sectional view of a semiconductor device according to an embodiment of the present invention.

FIG. 4 illustrates a cross-sectional view of a semiconductor device according to an embodiment of the present invention.

Referring to FIG. 4, the semiconductor device includes a semiconductor substrate 100 including a cell region (i), a peripheral region (ii), and a guard pattern 120 defined by an epitaxial growth layer formed at the border 105 between the cell region (i) and the peripheral region (ii). The semiconductor device may further include active regions 104A and 104B defined by device isolation layers 102A to 102C formed in the semiconductor substrate 100. In an embodiment, the guard pattern 120 may have a same thickness (or height) as that of the device isolation layers 102A to 102C. In addition, the semiconductor device may include a mask pattern 106 defining trenches in the device isolation layer 102A and the active region 104A in the cell region (i), a gate 108 contained in the device isolation layer 102A and the active region 104A, an insulation layer 110 formed over the gate 108 and buried in the semiconductor substrate 100, an interlayer insulation layer 112 formed over the active region 104A and the mask pattern 106 in the cell region (i), and a bit line contact plug 114 formed to pass through the interlayer insulation layer 112 and be coupled to the active region 104A in the cell region (i).

As described above, the semiconductor device according to this embodiment of the present invention is formed to include the guard pattern 120 including an epitaxial growth layer. This guard pattern can prevent oxidant gas of an oxidation process performed in the peripheral region (ii), from being applied to the cell region (i).

A method for forming the semiconductor device illustrated in FIG. 4 will hereinafter be described in detail. FIGS. 5a to 5d are cross-sectional views illustrating a method for forming the semiconductor device shown in FIG. 4.

Figure 5A:
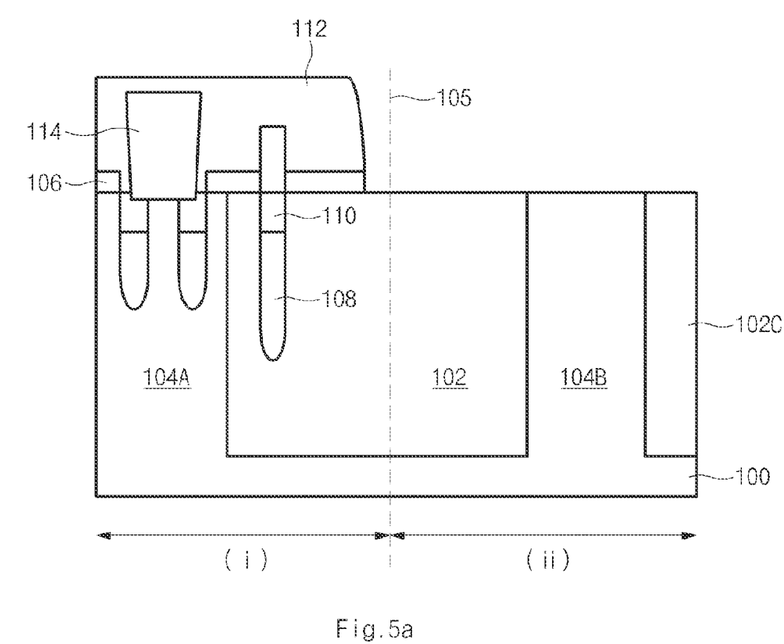
FIGS. 5a to 5d are cross-sectional views illustrating a method for forming the semiconductor device shown in FIG. 4.

Referring to FIG. 5a, active regions 104A and 104B are defined by device isolation layers 102 and 102C formed in a semiconductor substrate 100 including a cell region (i) and a peripheral region (ii). In addition, after a mask pattern 106 defining trenches is formed over the device isolation layer 102 and the active region 104A in the cell region (i), the active region 104A and the device isolation layer 102 in the cell region 100 are etched to form the trenches.

Subsequently, an electrode material is formed in a lower portion of the trench to form a gate 108 in the trench. The gate 108 may include a barrier metal layer and a metal layer. The barrier metal layer may include titanium nitride (TiN), and the metal layer may include tungsten (W).

Subsequently, an insulation layer 110 and an interlayer insulation layer 112 are sequentially formed over the gate 108. In accordance with an embodiment, the interlayer insulation layer 112 may be spaced apart from the border 105 between the cell region (i) and the peripheral region (ii) by a predetermined distance. More specifically, in some embodiments the interlayer insulation layer 112 may be formed to be spaced apart from the border 105 by the predetermined distance corresponding to about ½ of the width of a guard pattern to be formed in a subsequent process. Although it is not shown in FIG. 5a, materials formed over the peripheral region (ii) may be removed in such a manner that the semiconductor substrate 100 is exposed using a mask for opening the peripheral region (ii).

Figure 5B:
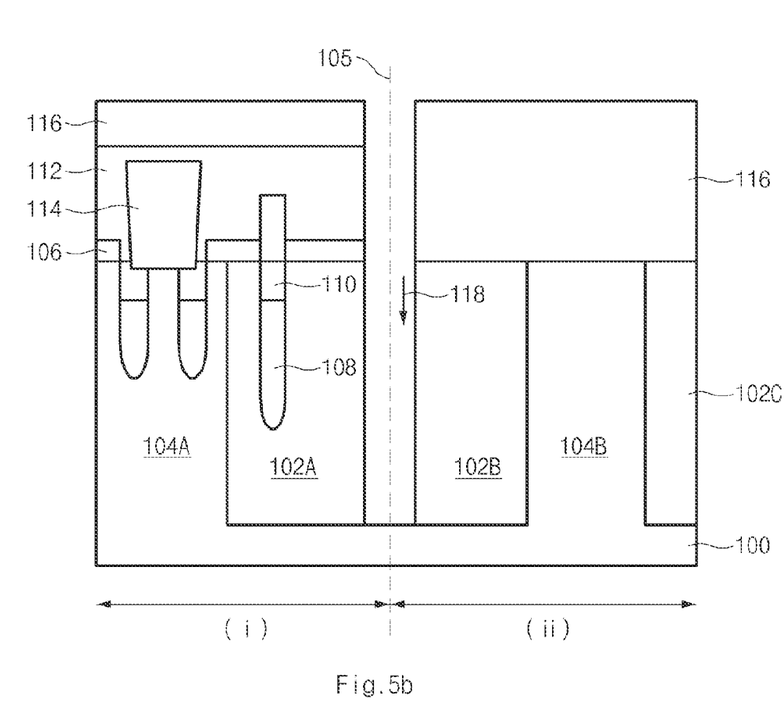

Referring to FIG. 5b, a mask pattern 116 is formed over the interlayer insulation layer 112 and the peripheral region (ii). The mask pattern 116 may be formed of a photoresist film, an oxide film, and/or a nitride film. The mask pattern 116 formed over the peripheral region (ii) may be spaced apart from the border 105 by the predetermined distance. Subsequently, a portion of the device isolation layer 102 that is disposed around the border 105 is etched using the mask pattern 116 as an etch mask, such that a guard pattern region 118 is formed around the border 105 in the semiconductor substrate 100, and the device isolation layer 102 is divided into a device isolation layer 102A in the cell region (i) and a device isolation layer 102B in the peripheral region (ii).

Figure 5C:
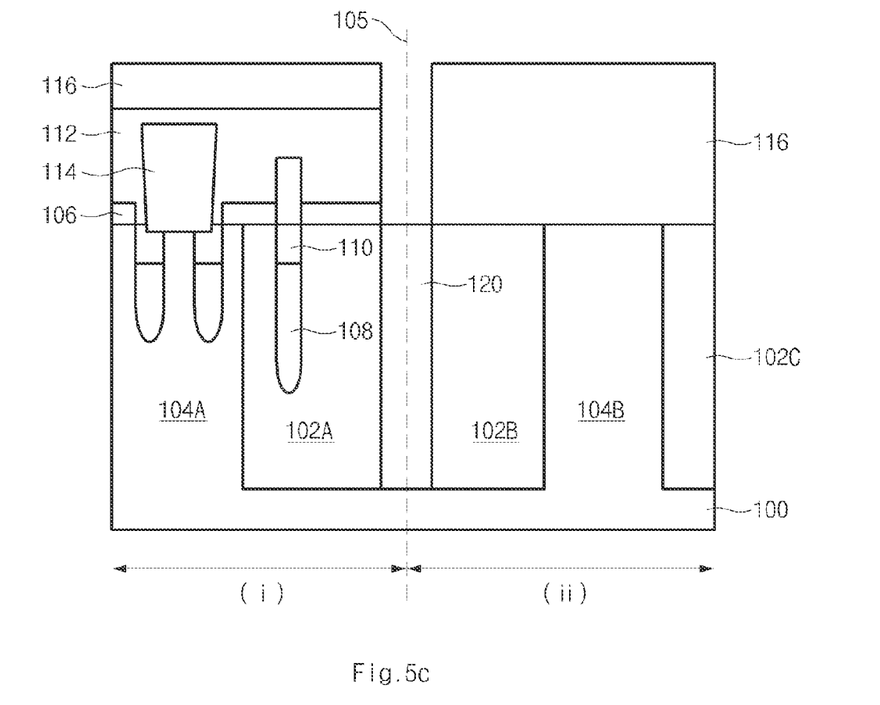

Referring to FIG. 5c, a guard pattern 120 is formed through an epitaxial growth method that uses the semiconductor substrate 100 as a seed so as to fill the guard pattern region 118. In accordance with an embodiment, the guard pattern 120 is formed by the epitaxial growth method after an ion implantation process has already been completed to form a well region. Thus it is possible to avoid ion implantation being performed on the guard pattern 120. Therefore, an N-well region or a P-well region is not formed in the guard pattern 120, such that a bias leakage path between wells is not generated even when the guard pattern 120 is oxidized.

In addition, since the guard pattern 120 may be formed after opening the peripheral region (ii), the guard pattern 120 is not damaged in the process of opening the peripheral region (ii).

Figure 5D:
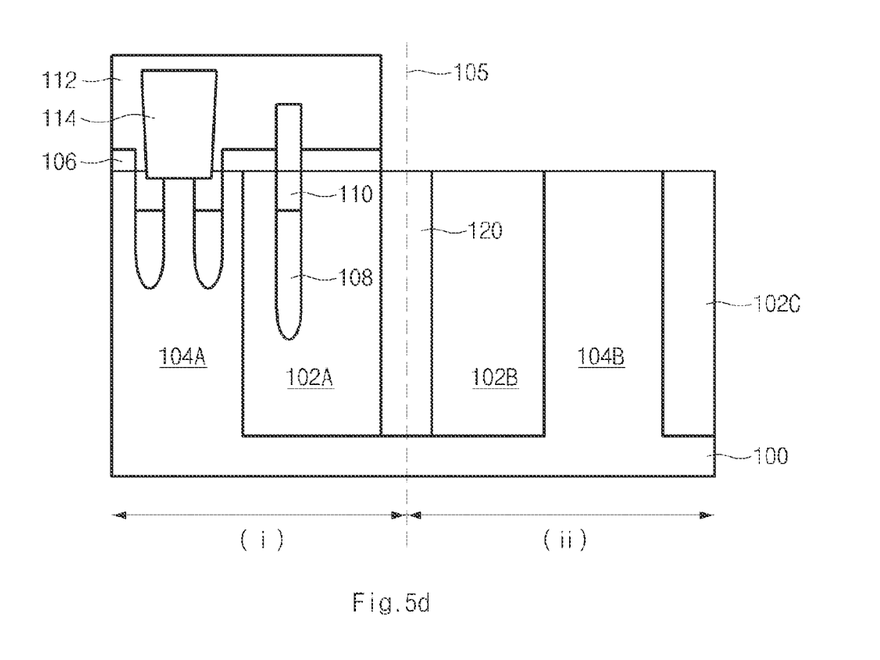

Referring to FIG. 5d, after the guard pattern 120 is formed, the mask pattern 116 is removed.

As is apparent from the above description, certain embodiments of the semiconductor device and the method for forming the same according may have one or more the following effects. The guard pattern may serve as a guard for blocking an oxidant gas from being applied to the cell region during an oxidation process in the peripheral region, such that no problem occurs in reliability of a gate oxide film formed in the cell region. In addition, since the guard pattern may be formed after a well ion-implantation process is performed, an N-well region or a µ-well region is not formed in the guard pattern. Moreover, the guard pattern may be formed after an etching process for opening the peripheral region is performed, such that the guard pattern is not damaged in the etching process.

The above embodiments of the present invention are illustrative and not limitative. Various alternatives and equivalents are possible. The invention is not limited by the embodiment described herein. Nor is the invention limited to any specific type of a semiconductor device. Other additions, subtractions, or modifications are obvious in view of the present disclosure and are intended to fall within the scope of the appended claims.

What is claimed is:

1. A method for forming a semiconductor device comprising:
    providing a semiconductor substrate including a cell region and a peripheral region;
    forming a device isolation layer defining an active region in the semiconductor substrate;
    after forming the device isolation layer, performing an ion implantation process to define a well region in the semiconductor substrate; and
    after performing the ion implantation process, forming a guard pattern in the device isolation layer located at a border between the cell region and the peripheral region, the guard pattern including a growth layer.

2. The method according to claim 1, further comprising:
    after performing the ion implantation process and before forming the guard pattern, etching materials formed over the semiconductor substrate using a mask for opening the peripheral region to expose a portion of the semiconductor substrate that corresponds to the peripheral region.

3. The method according to claim 1, wherein forming the guard pattern comprises:
    forming a mask pattern to expose a top surface of a portion of the device isolation layer located at the border;
    etching the portion of the device isolation layer using the mask pattern as an etch mask until the semiconductor substrate is exposed; and
    forming the growth layer in a region where the portion of the device isolation layer is etched using the semiconductor substrate as a seed for the growth.

4. The method according to claim 3, wherein the growth layer is formed to have substantially the same thickness as that of the device isolation layer.

5. The method according to claim 3, wherein the mask pattern includes a photoresist film, an oxide film, or a nitride film.

6. A method for forming a semiconductor device comprising:
    providing a semiconductor substrate including a cell region and a peripheral region;
    forming a device isolation layer to define an active region in the cell region and the peripheral region;

exposing a top surface of the semiconductor substrate by etching a portion of the device isolation layer located at a border between the cell region and the peripheral region; and performing a growth on the exposed semiconductor substrate to form a guard pattern in the device isolation layer located at the border, wherein the device isolation layer is an insulation layer.

7. The method according to claim 6, wherein the performing of the growth includes generating an epitaxial growth layer to have substantially the same thickness as that of the device isolation layer.

8. The method according to claim 6, wherein the growth is an epitaxial growth.

9. The method according to claim 6, further comprising:
after forming the device isolation layer and before performing the growth, performing an ion implantation process to define a well region in the semiconductor substrate.

10. The method according to claim 9, further comprising:
after performing the ion implantation process and before performing the growth, etching materials formed over the semiconductor substrate using a mask for opening the peripheral region to expose a portion of the semiconductor substrate that corresponds to the peripheral region.

* * * * *